(12) United States Patent
Wang et al.

(10) Patent No.: US 12,040,412 B2
(45) Date of Patent: Jul. 16, 2024

(54) SEMICONDUCTOR DEVICE AND METHOD OF FORMING THE SAME

(71) Applicant: Winbond Electronics Corp., Taichung (TW)

(72) Inventors: Yu-Lung Wang, Taichung (TW);
Yao-Ting Tsai, Taichung (TW);
Jian-Ting Chen, Taichung (TW);
Yuan-Huang Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 299 days.

(21) Appl. No.: 17/375,000

(22) Filed: Jul. 14, 2021

(65) Prior Publication Data
US 2023/0017264 A1 Jan. 19, 2023

(51) Int. Cl.
*H01L 29/78* (2006.01)
*H01L 21/311* (2006.01)
(Continued)

(52) U.S. Cl.
CPC ...... *H01L 29/788* (2013.01); *H01L 21/31111* (2013.01); *H01L 21/31116* (2013.01);
(Continued)

(58) Field of Classification Search
CPC ......... H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878;
(Continued)

(56) References Cited

U.S. PATENT DOCUMENTS 9,330,923 B1 * 5/2016 Shih .................. H10B 41/30
2012/0241838 A1 9/2012 Nagashima et al.
(Continued)

FOREIGN PATENT DOCUMENTS

TW 201519367 5/2015
TW 201528346 7/2015
(Continued)

OTHER PUBLICATIONS

"Office Action of Taiwan Counterpart Application", issued on Jan. 7, 2022, p. 1-p. 5.

*Primary Examiner* — Moin M Rahman
(74) *Attorney, Agent, or Firm* — JCIPRNET

(57) ABSTRACT

Provided is a semiconductor device including a substrate, multiple first gate structures, and a protective structure. The substrate includes a first region and a second region. The first gate structures are disposed on the substrate in the first region. The protective structure conformally covers a sidewall of one of the first gate structures adjacent to the second region. The protective structure includes a lower portion and an upper portion disposed on the lower portion. The lower portion and the upper portion have different dielectric materials. A method of forming a semiconductor device is also provided.

12 Claims, 12 Drawing Sheets

(51) Int. Cl.
  *H01L 29/40* (2006.01)
  *H01L 29/417* (2006.01)
  *H01L 29/66* (2006.01)
  *H01L 29/788* (2006.01)
  *H10B 41/30* (2023.01)

(52) U.S. Cl.
  CPC ...... *H01L 21/31144* (2013.01); *H01L 29/401* (2013.01); *H01L 29/41775* (2013.01); *H01L 29/6653* (2013.01); *H10B 41/30* (2023.02)

(58) Field of Classification Search
  CPC ........... H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 21/845; H01L 27/10826; H01L 27/10879; H01L 27/1211; H01L 2924/13067; H01L 29/1054; H01L 29/66803; H01L 29/51; H01L 29/10; H01L 29/78; H01L 21/28; H01L 21/28194; H01L 29/513; H01L 29/517
  See application file for complete search history.

(56) References Cited

U.S. PATENT DOCUMENTS

2015/0194314 A1\* 7/2015 Chu ........................ H10B 41/35
  438/666
2020/0083126 A1\* 3/2020 Lin .......................... H01L 22/34

FOREIGN PATENT DOCUMENTS

| | | |
|---|---|---|
| TW | 202109626 | 3/2021 |
| TW | 202121600 | 6/2021 |

\* cited by examiner

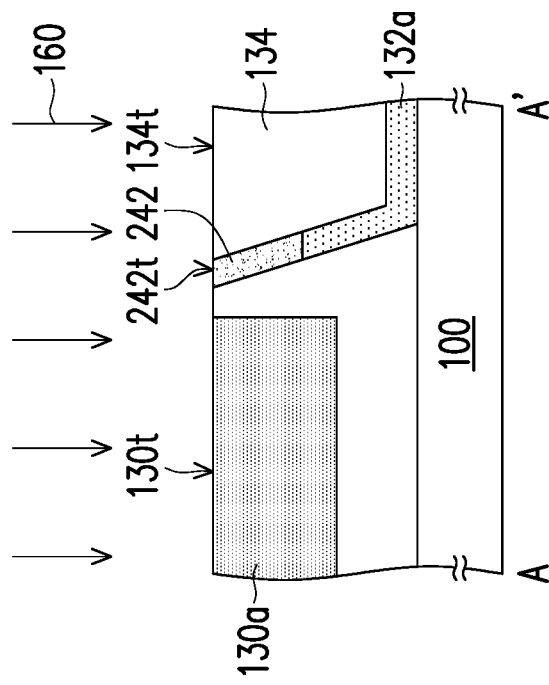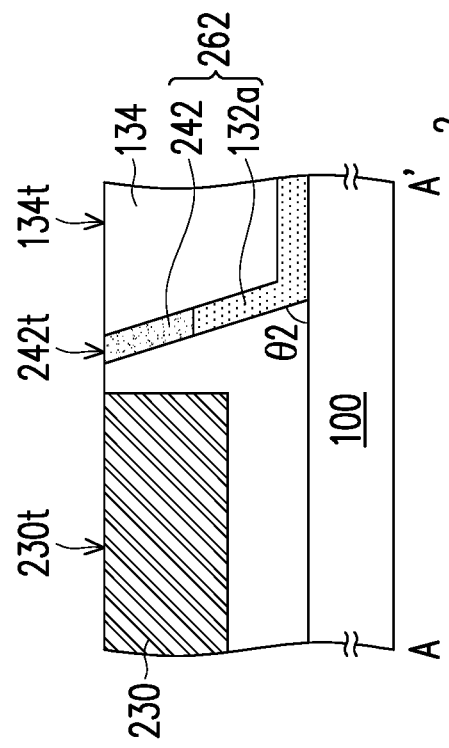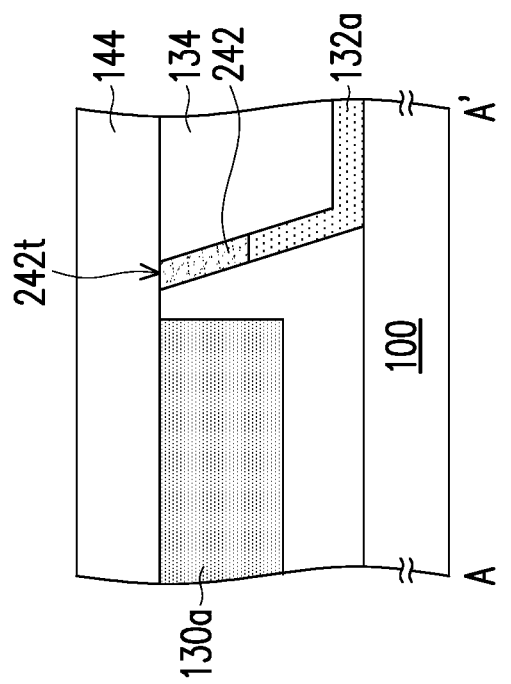

SEMICONDUCTOR DEVICE AND METHOD OF FORMING THE SAME

BACKGROUND

Technical Field

The disclosure is related to a semiconductor device having a flash memory and a method of forming the same.

Description of Related Art

With the improvement of semiconductor technology, the size of semiconductor devices is increasingly smaller so that the integration of the semiconductor devices increases, and devices with more functions are integrated on one single chip. In this case, the line width in the semiconductor devices is also gradually reduced to make electronic products light, thin, and compact according to requirements.

However, as critical dimensions in the semiconductor devices become increasingly smaller, the semiconductor process technology will also face many challenges. For example, tungsten residue around a stitch region or a peripheral circuit region forms a leakage path between source and drain contacts, decreasing the yield of the semiconductor devices.

SUMMARY

The disclosure provides a semiconductor device and a method of forming the same, which may solve the problem of tungsten residue around a stitch region or a peripheral circuit region, thereby improving the yield of the semiconductor device.

The disclosure provides a semiconductor device including a substrate, multiple first gate structures, and a protective structure. The substrate includes a first region and a second region. The first gate structure is disposed on the substrate in the first region. The protective structure conformally covers a sidewall of one of the first gate structures adjacent to the second region. The protective structure includes a lower portion and an upper portion disposed on the lower portion. The lower portion and the upper portion have different dielectric materials.

The disclosure provides a method of forming a semiconductor device, including the following steps. A substrate including a unit cell region and a peripheral region is provided. Multiple first gate structures are formed on the substrate in the unit cell region. At least one second gate structure is formed on the substrate in the peripheral region. A sacrificial material is formed on the first gate structures in the unit cell region. A stop layer is formed to conformally cover a surface of the sacrificial material and a sidewall of one of the at least one second gate structure and the first gate structures adjacent to the peripheral region. An interlayer dielectric layer is formed on the stop layer in the peripheral region. A first etching process is performed to remove the stop layer on a top surface of the sacrificial material and further etch the stop layer between the sacrificial material and the interlayer dielectric layer to form a first opening. A protective layer is formed to be filled in the first opening, and the protective layer and the stop layer have different dielectric materials. The sacrificial material is patterned to form multiple dummy contacts between the first gate structures.

Based on the above, the embodiments of the disclosure form the protective structure between the unit cell region and the stitch region and/or between the unit cell region and the peripheral region to avoid the loss of the stop layer during the etching back process. In this case, after the contact replacement process, metal tungsten does not remain around the stitch region or the peripheral circuit region. Therefore, the embodiments of the disclosure may avoid a leakage path formed by the tungsten residue between the source/drain contacts, thereby increasing the yield of the semiconductor device.

BRIEF DESCRIPTION OF THE DRAWINGS

FIG. 3A to FIG. 3E are schematic cross-sectional views of the manufacturing process of the semiconductor device taken along a line A-A' in FIG. 2.

DESCRIPTION OF THE EMBODIMENTS

Figure 1A:
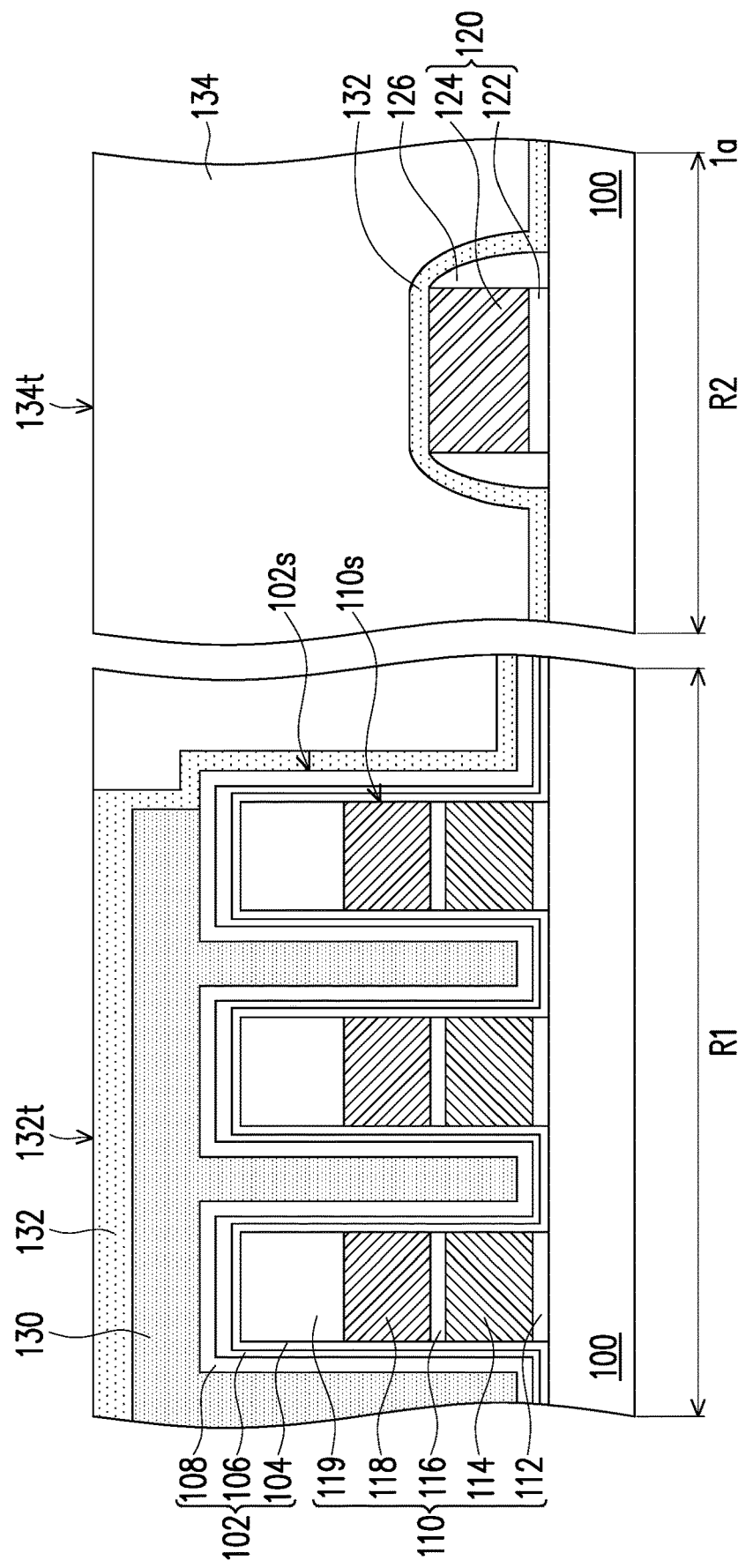
FIG. 1A to FIG. 1J are schematic cross-sectional views of a manufacturing process of a semiconductor device according to the first embodiment of the disclosure.

The disclosure may be understood more comprehensively by referring to the drawings. However, the disclosure may also be embodied in various forms and should not be limited to the embodiments described herein. The thickness of layers and the thickness of regions in the drawings are magnified for clarity. The same or similar elements are designated by the same or similar reference numerals, and descriptions thereof are omitted in the following paragraphs.

Figure 1B:
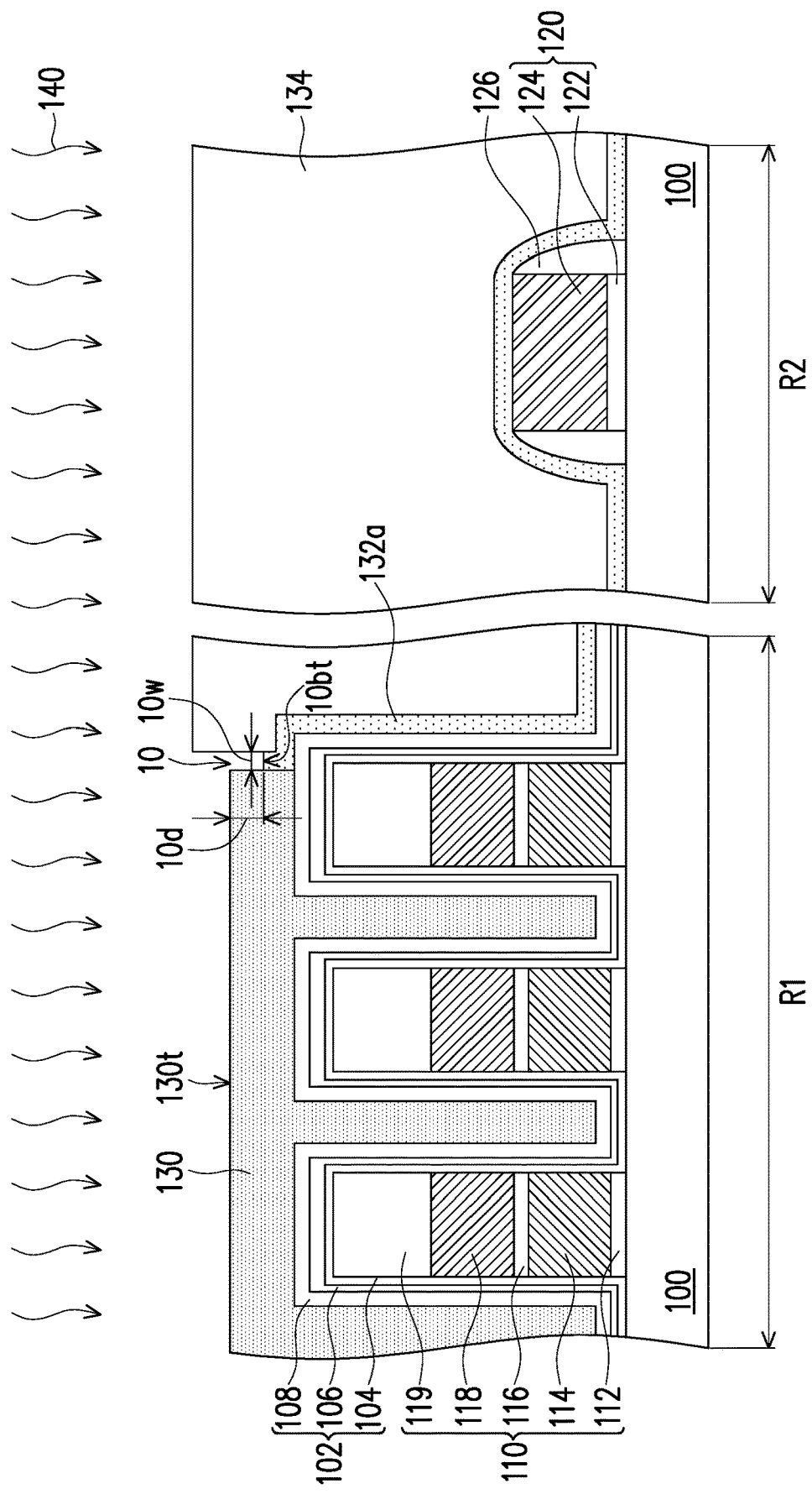
Figure 1C:
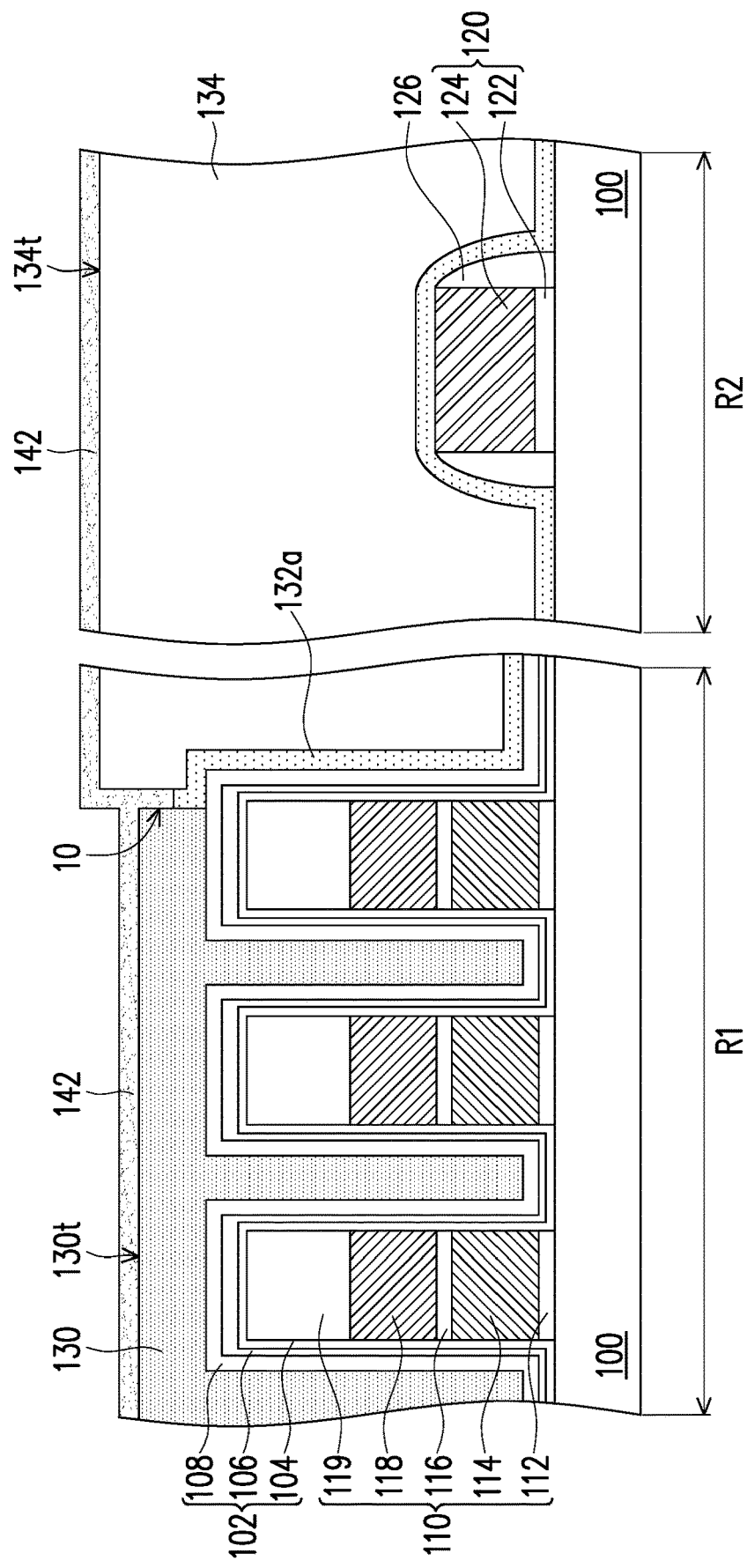
Figure 1D:
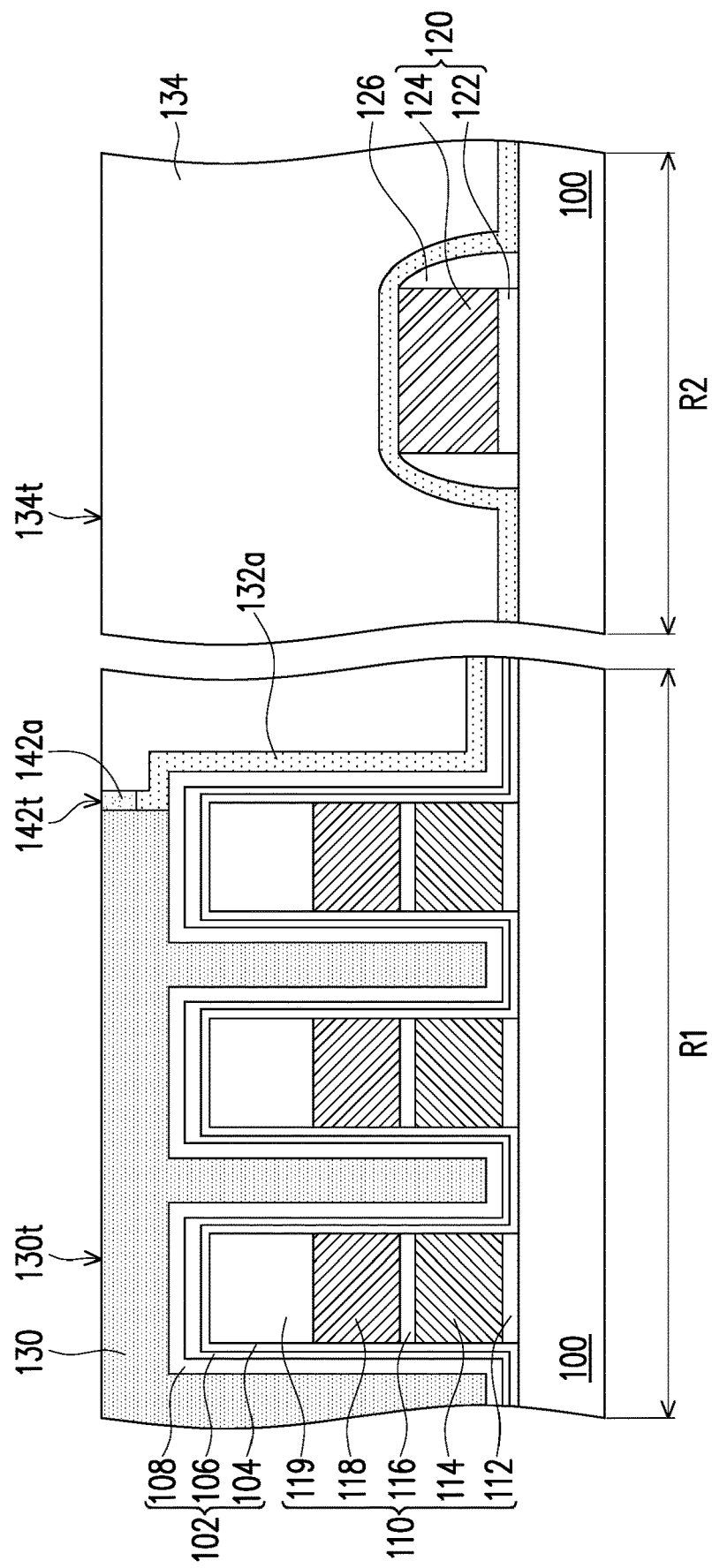
Figure 1E:
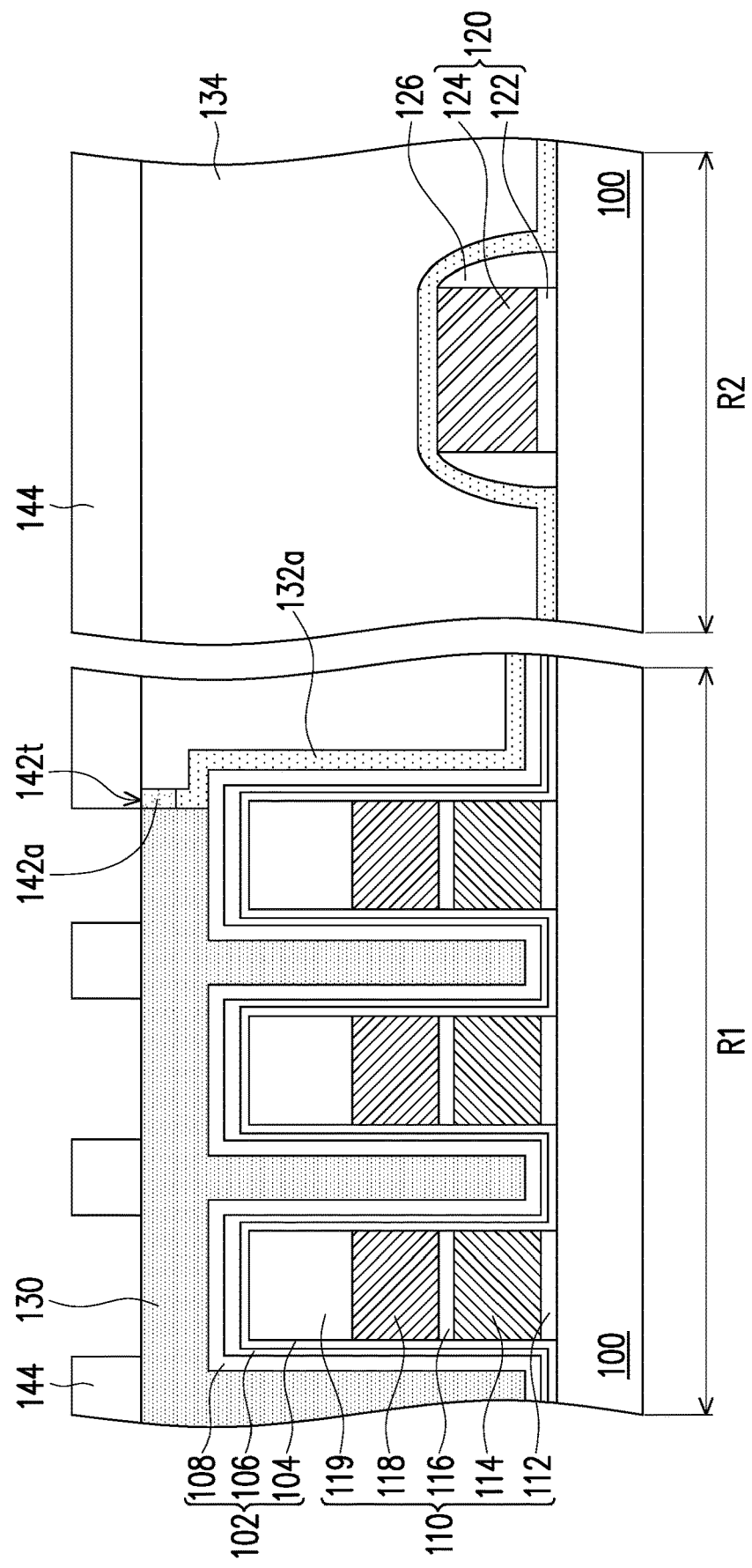
Figure 1F:
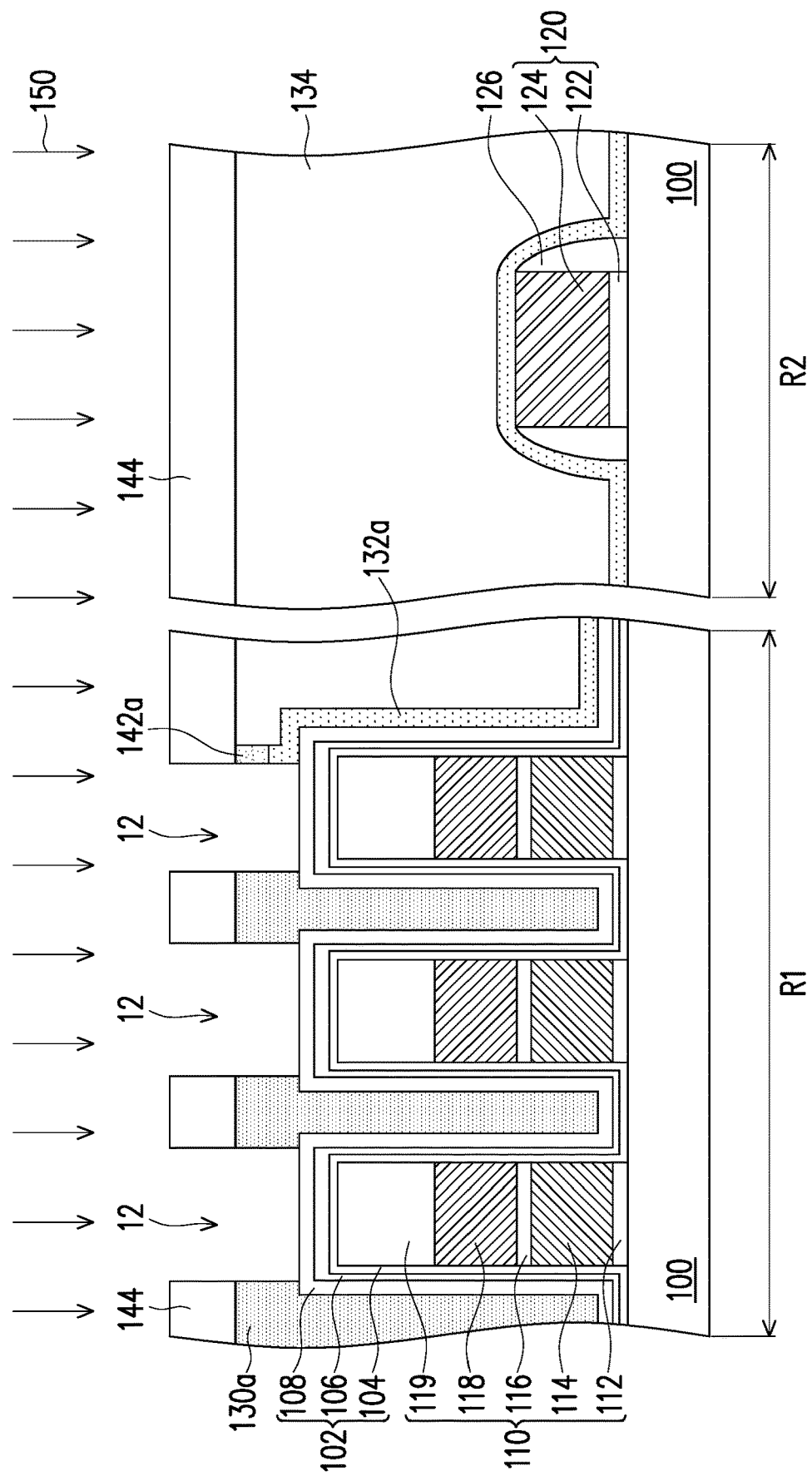
Figure 1G:
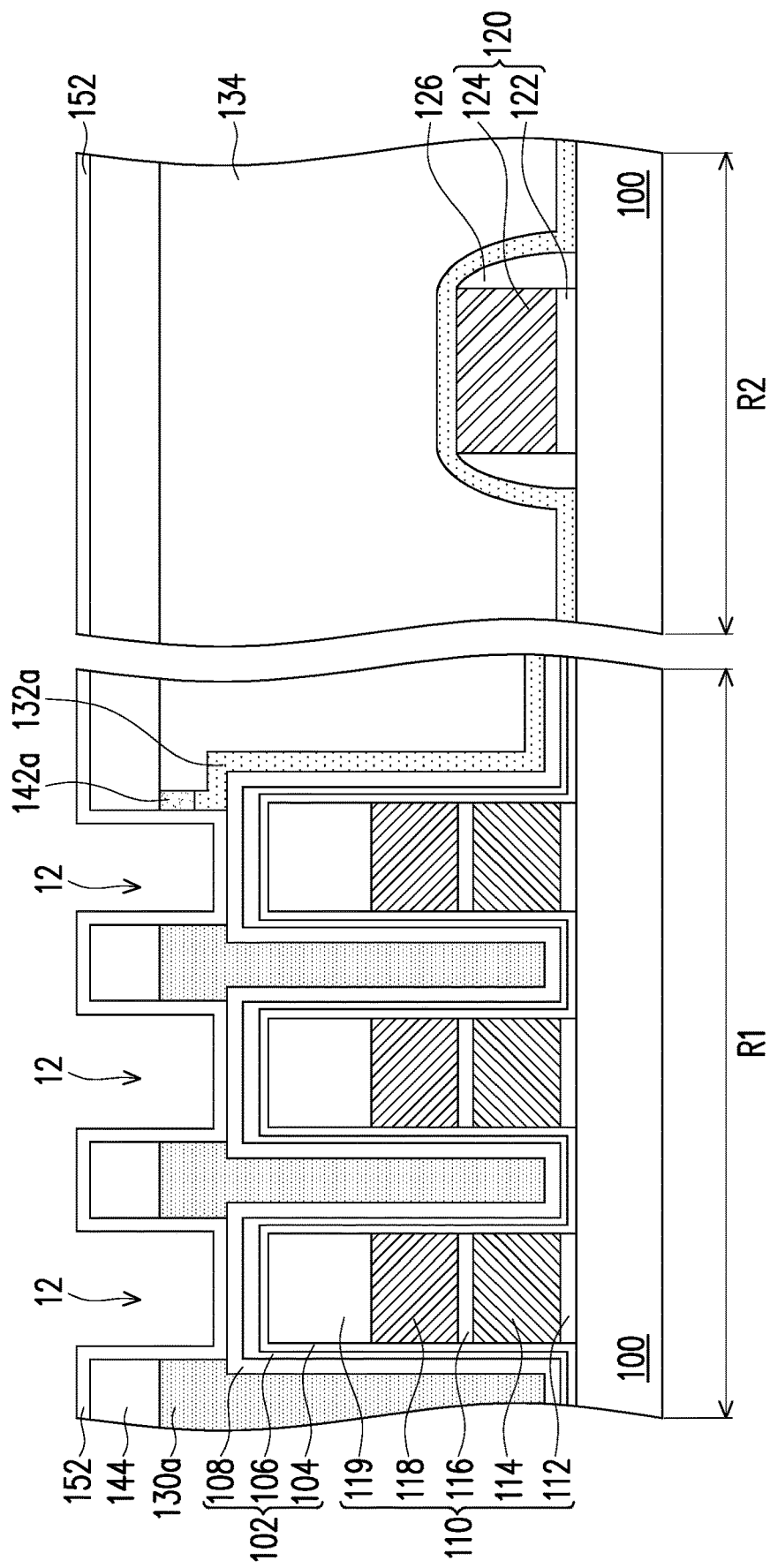
Figure 1H:
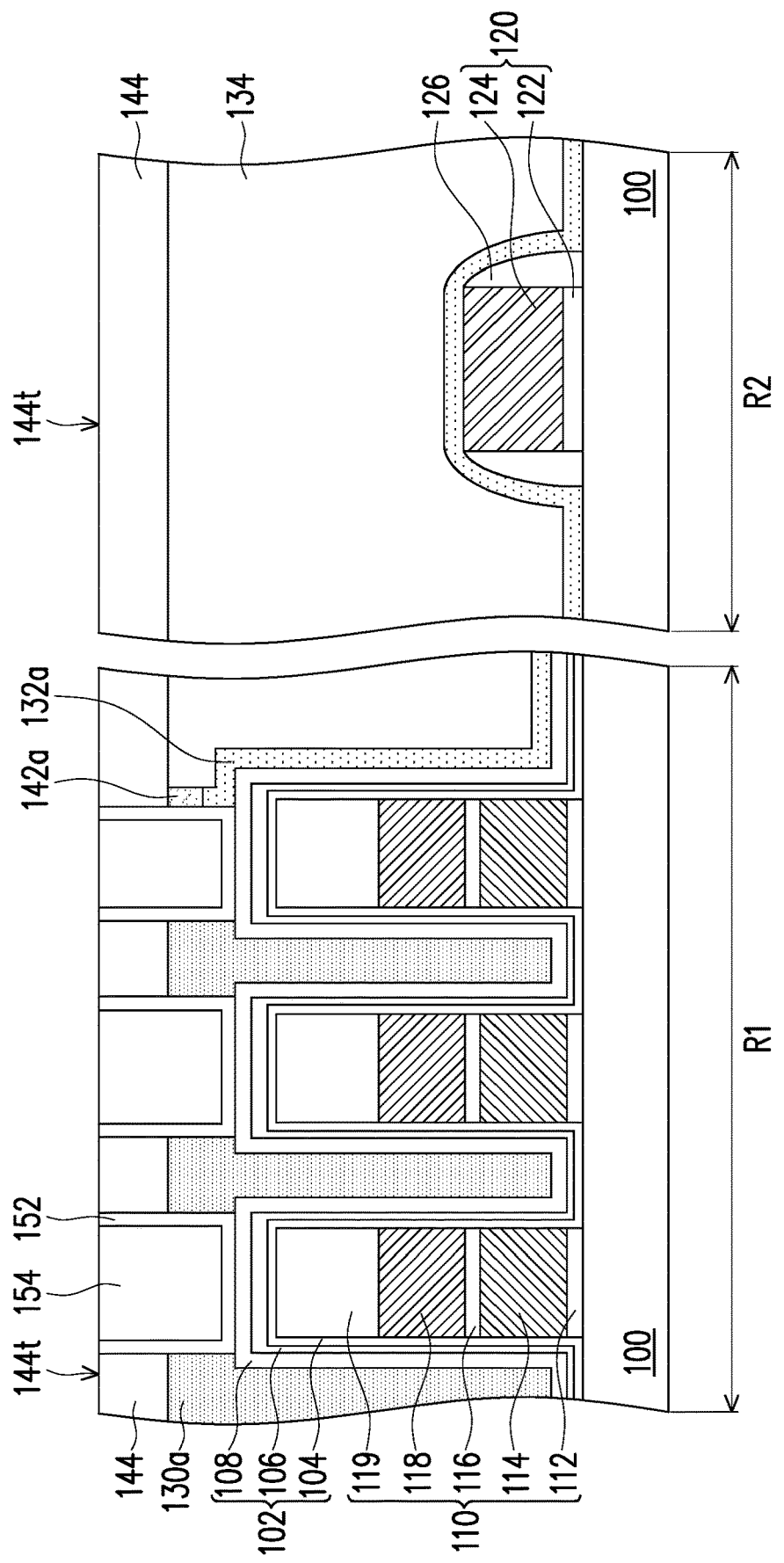
Figure 1I:
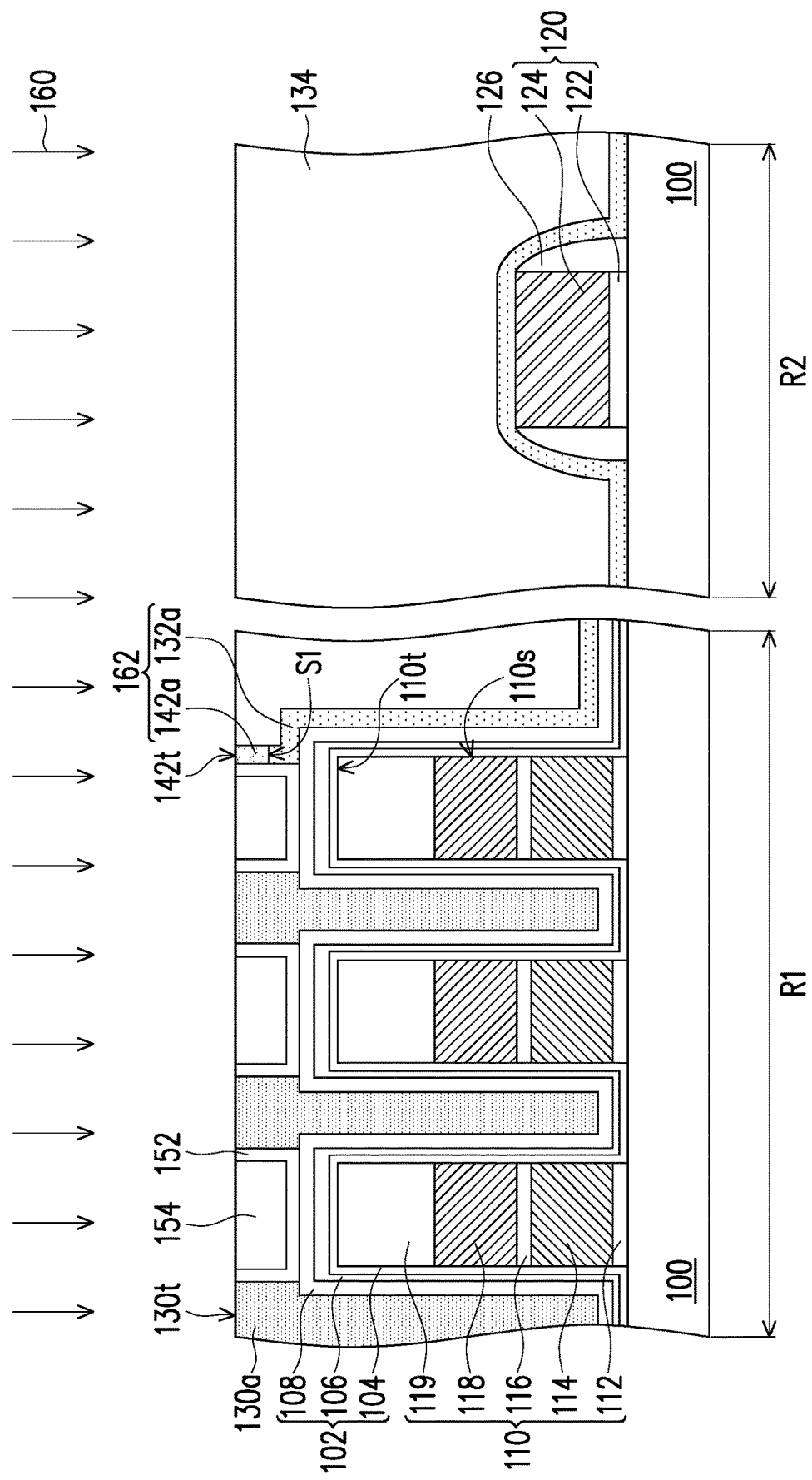
Figure 1J:
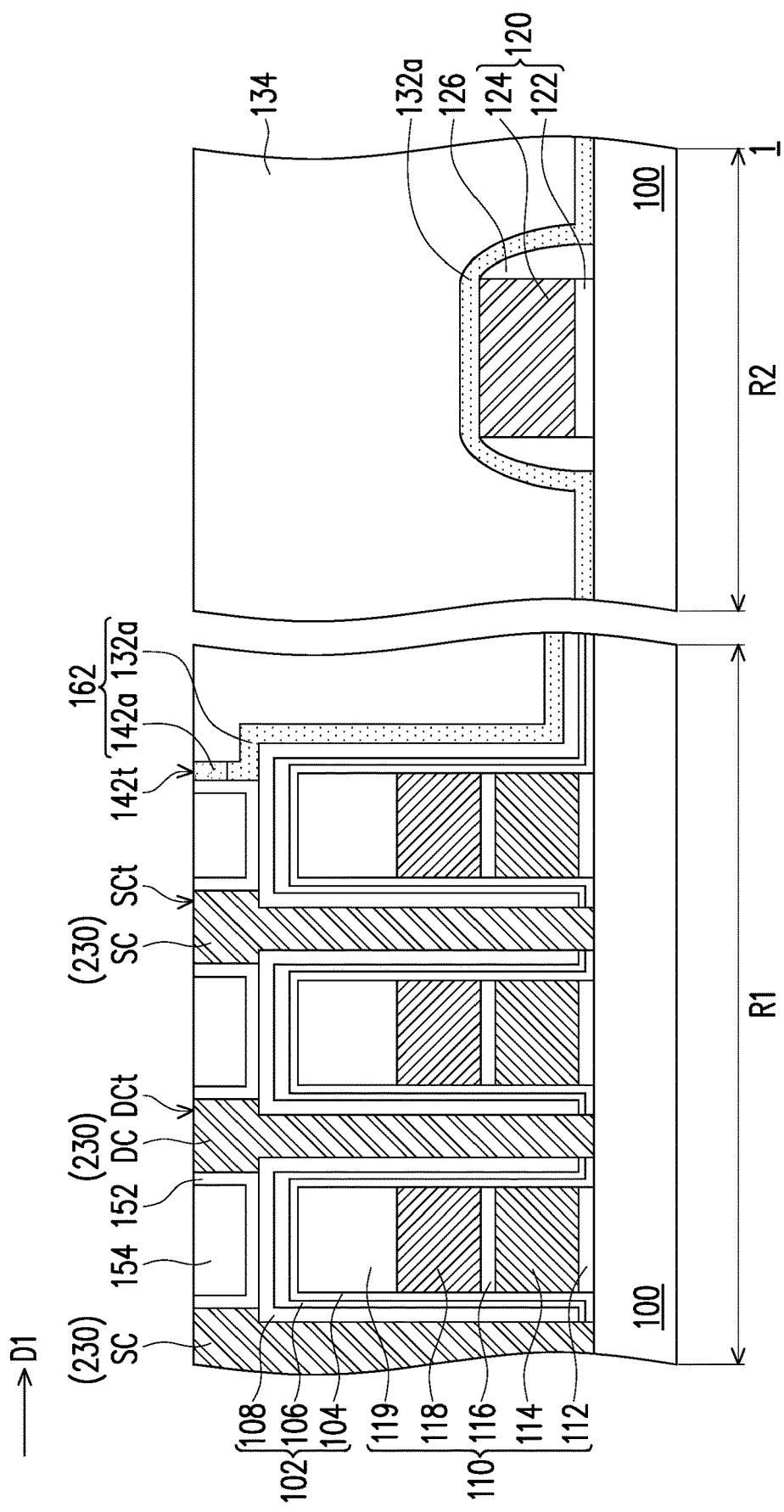

With reference to FIG. 1A, this embodiment provides a method of manufacturing a semiconductor device 1 (as shown in FIG. 1J), and steps thereof are as follows. First, an initial structure 1a is provided, including a substrate 100, multiple first gate structures 110, and at least one second gate structure 120. The substrate 100 may include a first region R1 and a second region R2. In an embodiment, the first region R1 may be a unit cell region, and the second region R2 may be a peripheral region. In an embodiment, the substrate 100 may be, for example, a semiconductor substrate, a semiconductor compound substrate, or a semiconductor over insulator (SOI). In this embodiment, the substrate 100 may be a silicon substrate.

The first gate structures 110 may be disposed on the substrate 100 in the first region R1. In this embodiment, the first gate structure 110 may be a flash memory structure. Specifically, each of the first gate structures 110 may sequentially include a tunnel dielectric layer 112, a floating gate 114, an inter-gate dielectric layer 116, a control gate 118, and a cap layer 119 from bottom to top. In other words, the tunnel dielectric layer 112 is disposed on the substrate 100 in the first region R1. The floating gate 114 is disposed on the tunnel dielectric layer 112. The inter-gate dielectric layer 116 is disposed on the floating gate 114. The control gate 118 is disposed on the inter-gate dielectric layer 116. The cap layer 119 is disposed on the control gate 118.

In an embodiment, a material of the tunnel dielectric layer 112 may be, for example, silicon oxide, and its formation method may be a chemical vapor deposition (CVD) method, a thermal oxidation method, or the like. In an embodiment, a material of the floating gate 114 may include a conductor material, such as doped polysilicon, non-doped polysilicon, or a combination thereof, and its formation method may be the CVD method. In an embodiment, the inter-gate dielectric layer 116 may be, for example but not limited to, a composite layer composed of nitride/oxide/nitride/oxide/nitride (NONON). The composite layer may have three, five, or more layers, and a method of forming the inter-gate dielectric layer 116 may be, for example, the CVD method. In an embodiment, a material of the control gate 118 may include a conductor material, such as doped polysilicon, non-doped polysilicon, or a combination thereof, and its formation method may be the CVD method. In an embodiment, a material of the cap layer 119 may include a dielectric material, such as silicon nitride, silicon oxynitride, or a combination thereof, and its formation method may be the CVD method.

The at least one second gate structure 120 may be disposed on the substrate 100 in the second region R2. Specifically, the second gate structure 120 may include a gate dielectric layer 122 and a gate electrode 124 disposed on the gate dielectric layer 122. In an embodiment, a material of the gate dielectric layer 122 may be, for example, silicon oxide, and its formation method may be the CVD method, the thermal oxidation method, or the like. In an embodiment, a material of the gate electrode 124 may include a conductor material, such as doped polysilicon, non-doped polysilicon, or a combination thereof, and its formation method may be the CVD method. In this embodiment, the first gate structure 110 and the second gate structure 120 may have different sizes, which are, for example, different heights and/or different widths. In addition, the thickness of the gate dielectric layer 122 of the second gate structure 120 may be different from the thickness of the tunnel dielectric layer 112 of the first gate structure 110. In addition, although FIG. 1A only illustrates one second gate structure 120, the disclosure is not limited thereto. In other embodiments, the number of the second gate structure 120 may be adjusted according to requirements.

As shown in FIG. 1A, the initial structure 1a further includes spacers 102 and 126, a sacrificial material 130, a stop layer 132, and an interlayer dielectric (ILD) layer 134. Specifically, the spacer 102 may include a single-layer structure, a double-layer structure, or a multi-layer structure. For example, the spacer 102 may include a silicon oxide layer 104, a silicon nitride layer 106, and a silicon oxide layer 108. The spacer 102 may conformally cover a surface of the first gate structures 110. On the other hand, the spacer 126 may be disposed on a sidewall of the second gate structure 120. In an embodiment, a material of the spacer 126 may include a dielectric material, such as silicon oxide, silicon nitride, or a combination thereof. Although the spacer 126 shown in FIG. 1A is a single-layer structure, the disclosure is not limited thereto. In other embodiments, the spacer 126 may also be a double-layer structure or a multi-layer structure.

The sacrificial material 130 may be disposed on the spacer 102. In detail, the sacrificial material 130 may be filled in a space between the first gate structures 110 and extend to cover a top surface of the first gate structures 110. In an embodiment, a material of the sacrificial material 130 may include a conductor material, such as doped polysilicon, non-doped polysilicon, or a combination thereof, and its formation method may be the CVD method.

The stop layer 132 may conformally cover the second gate structure 120, a sidewall 110s of the first gate structures 110 adjacent to the second region R2 (or a sidewall 102s of the spacer 102), and a surface of the sacrificial material 130. In an embodiment, a material of the stop layer 132 may include a dielectric material, such as silicon nitride, silicon oxynitride, or other dielectric material containing nitrogen, and its formation method may be the CVD method.

The ILD layer 134 may be disposed on the stop layer 132 in the second region R2. In an embodiment, a material of the ILD layer 134 includes silicon oxide, a low-k dielectric material, or other dielectric material. Here, the low-k means a dielectric constant less than or equal to 4. The steps of forming the ILD layer 134 may include: forming an ILD material on the substrate 100 and performing a planarization process, such as a chemical-mechanical planarization (CMP) process, to expose a top surface 132t of the stop layer 132 in the first region R1. It should be noted that the stop layer 132 and the ILD layer 134 in the first region R1 may have different dielectric materials with different polishing rates. For example, the stop layer 132 may be silicon nitride, and the ILD layer 134 may be silicon oxide. In this case, the above planarization process may remove most of the ILD material composed of silicon oxide and stop on the top surface 132t of the stop layer 132. In other words, the stop layer 132 may be regarded as a polishing stop layer of the above planarization process. In this embodiment, the top surface 132t of the stop layer 132 in the first region R1 and a top surface 134t of the ILD layer 134 may be regarded to be substantially coplanar.

With reference to FIG. 1B, a first etching process 140 is performed to remove the stop layer 132 on a top surface 130t of the sacrificial material 130 and further etch part of the stop layer 132 between the sacrificial material 130 and the ILD layer 134 to form a first opening 10. In an embodiment, the first etching process 140 may be a wet etching process. For example, when the stop layer 132 is silicon nitride, the first etching process 140 may use etching solution containing phosphoric acid to remove the stop layer 132. Since the etching solution used in the first etching process 140 has high etching selectivity for the stop layer 132, the stop layer 132 composed of silicon nitride may be largely removed, and the sacrificial material 130 composed of polysilicon and the ILD layer 134 composed of silicon oxide may not be removed or only be slightly removed. In this case, the first opening 10 may have a width 10w and a depth 10d. The depth 10d is a distance between the top surface 130t of the sacrificial material 130 and a bottom surface 10bt of the first opening 10. In this embodiment, the width 10w of the first opening 10 may be between 30 nm and 40 nm, such as 35 nm. The depth 10d of the first opening 10 may be between 130 nm and 150 nm, such as 140 nm. An aspect ratio of the first opening 10 may be between 5 and 3.25, such as 4.

With reference to FIG. 1C, a protective material 142 is formed to cover the top surface 130t of the sacrificial material 130 and the top surface 134t of the ILD layer 134, and is filled in the first opening 10. In an embodiment, the protective material 142 and the stop layer 132a have different dielectric materials. For example, the protective material 142 may be an oxide material such as silicon oxide, and the stop layer 132 may be a nitride material such as silicon nitride, but the disclosure is not limited thereto. As long as the protective material 142 and the stop layer 132a are materials with a high etching selectivity ratio, they fall within the scope covered by the disclosure. In addition, it should be noted that due to the high aspect ratio of the first opening 10, an enhanced high aspect ratio process (eHARP) may be used in this embodiment to form the protective material 142, thereby reducing voids of the protective material 142 in the first opening 10. In this case, the protective material 142 may be an eHARP oxide, but the disclosure is not limited thereto. In other embodiments, the protective material 142 may also be formed by the CVD method or an atomic layer deposition (ALD) method. In an embodiment, the voids in an eHARP oxide are smaller than the voids in a CVD oxide or an ALD oxide. On the other hand, the density of the eHARP oxide is greater than the density of the CVD oxide or the ALD oxide.

With reference to FIG. 1C and FIG. 1D, a planarization process, such as the CMP process, is performed to remove the protective material 142 on the top surface 130t of the sacrificial material 130, the protective material 142 on the top surface 134t of the ILD layer 134, and part of the ILD layer 134 to form a protective layer 142a in the first opening 10. In this case, the top surface 130t of the sacrificial material 130, a top surface 142t of the protective layer 142a, and the top surface 134t of the ILD layer 134 may be regarded to be coplanar.

With reference to FIG. 1E and FIG. 1F, the sacrificial material 130 is patterned to form multiple dummy contacts 130a between the first gate structures 110. Specifically, as shown in FIG. 1E, a mask pattern 144 is formed on the substrate 100. The mask pattern 144 may cover or not cover the top surface 142t of the protective layer 142a. In an embodiment, a material of the mask pattern 144 may include a dielectric material, such as silicon nitride, silicon oxynitride, or other dielectric material containing nitrogen, and its formation method may be the CVD method. Next, a second etching process 150 is performed by using the mask pattern 144 as a mask to remove part of the sacrificial material 130, thereby forming multiple second openings 12. In this case, as shown in FIG. 1F, the second openings 12 expose the spacer 102 above the first gate structures 110, and expose part of a surface of the protective layer 142a. In an embodiment, the second etching process 150 may be a dry etching process, such as a reactive ion etching (RIE) process.

With reference to FIG. 1G, a liner layer 152 may be selectively formed to conformally cover the mask pattern 144 and a surface of the second openings 12. In an embodiment, a material of the liner layer 152 may include a dielectric material, such as silicon oxide, silicon nitride, silicon oxynitride, or a combination thereof, and its formation method may be the CVD method.

With reference to FIG. 1G and FIG. 1H, a dielectric layer 154 is formed in the second openings 12. In an embodiment, a material of the dielectric layer 154 may include a dielectric material, such as tetraethoxysilane (TEOS). A step of forming the dielectric layer 154 may include: forming a dielectric material on the substrate 100 and performing a planarization process, such as the CMP process, to expose a top surface 144t of the mask pattern 144.

With reference to FIG. 1I, an etching back process 160 is performed to remove part of the liner layer 152, part of the dielectric layer 154, and the mask pattern 144, thereby exposing the top surface 130t of the dummy contacts 130a and the top surface 142t of the protective layer 142a. In an embodiment, the etching back process 160 may be a dry etching process, for example, the reactive ion etching (RIE) process. In this embodiment, since the etching back process 160 has high etching selectivity for the mask pattern 144, the mask pattern 144 composed of silicon nitride may be completely removed. In this case, the etching back process 160 may be stopped on the dummy contacts 130a composed of polysilicon and the protective layer 142a composed of silicon oxide. As shown in FIG. 1I, the dummy contacts 130a may be formed between the first gate structures 110 and be separated from the first gate structures 110 by the spacer 102.

It should be noted that this embodiment replaces silicon nitride with silicon oxide for the upper portion of the stop layer. Therefore, the protective layer 142a composed of silicon oxide may protect the stop layer 132a composed of silicon nitride from being etched by the etching back process 160 and forming a groove. In this embodiment, the stop layer 132a and the protective layer 142a may be regarded as a protective structure 162. The protective structure 162 may conformally cover the sidewall 110s of the first gate structures 110 adjacent to the second region R2, and may be clamped between the ILD layer 134 and the spacer 102. On the other hand, the protective structure 162 may have a lower portion (i.e., the stop layer 132a) and an upper portion (i.e., the protective layer 142a) disposed on the lower portion 132a. An interface S1 between the lower portion 132a and the upper portion 142a may be higher than the top surface 110t of the first gate structure 110. The top surface 142t of the upper portion 142a may be exposed on the ILD layer 134. The lower portion 132a and the upper portion 142a may have different dielectric materials, and the upper portion 142a and the mask pattern 144 (shown in FIG. 1H) may have the same material. For example, a material of the lower portion 132a includes silicon nitride, and a material of the upper portion 142a and the mask pattern 144 includes silicon nitride.

With reference to FIG. 1I and FIG. 1J, a replacement process is performed to replace the dummy contacts 130a with metal contacts 230. Specifically, the dummy contacts 130a and part of the spacer 102 below the dummy contacts 130a are removed to form multiple contact openings exposing the substrate 100. Next, a conductor material is formed to be filled in the contact openings. In an embodiment, the conductor material is different from the sacrificial material 130. The conductor material may include a metal material (such as W, Cu, AlCu, or the like), a barrier metal (such as Ti, TiN, Ta, TaN, or the like), or a combination thereof, and its formation method may be an electroplating method, a physical vapor deposition (PVD) method, the CVD method, or other appropriate formation method. In following, a planarization process, such as the CMP process, is performed to remove the excess conductor material on the dielectric layer 154, the ILD layer 134, and the protective layer 142a to form a source contact SC and a drain contact DC. In this case, the top surface 142t of the protective layer 142a may be substantially coplanar with a top surface SCt of the source contact SC and a top surface DCt of the drain contact DC. In other words, after the CMP process, no metal residue is formed on the stop layer 132a between the unit cell region R1 and the peripheral region R2. Therefore, this embodiment may avoid a leakage path formed between the source contacts SC and/or the drain contacts DC, thereby increasing the yield of the semiconductor device 1.

In an embodiment, the source contacts SC may be disposed on the first side of the first gate structure 110, and the drain contacts DC may be disposed on the second side of the first gate structure 110 relative to the first side. In other words, the source contacts SC and the drain contacts DC may be alternately disposed along a direction D1 parallel to the substrate 100. In addition, as shown in FIG. 1J, the source contacts SC and the drain contacts DC may be separated from the first gate structures 110 by the spacer 102.

Figure 2:
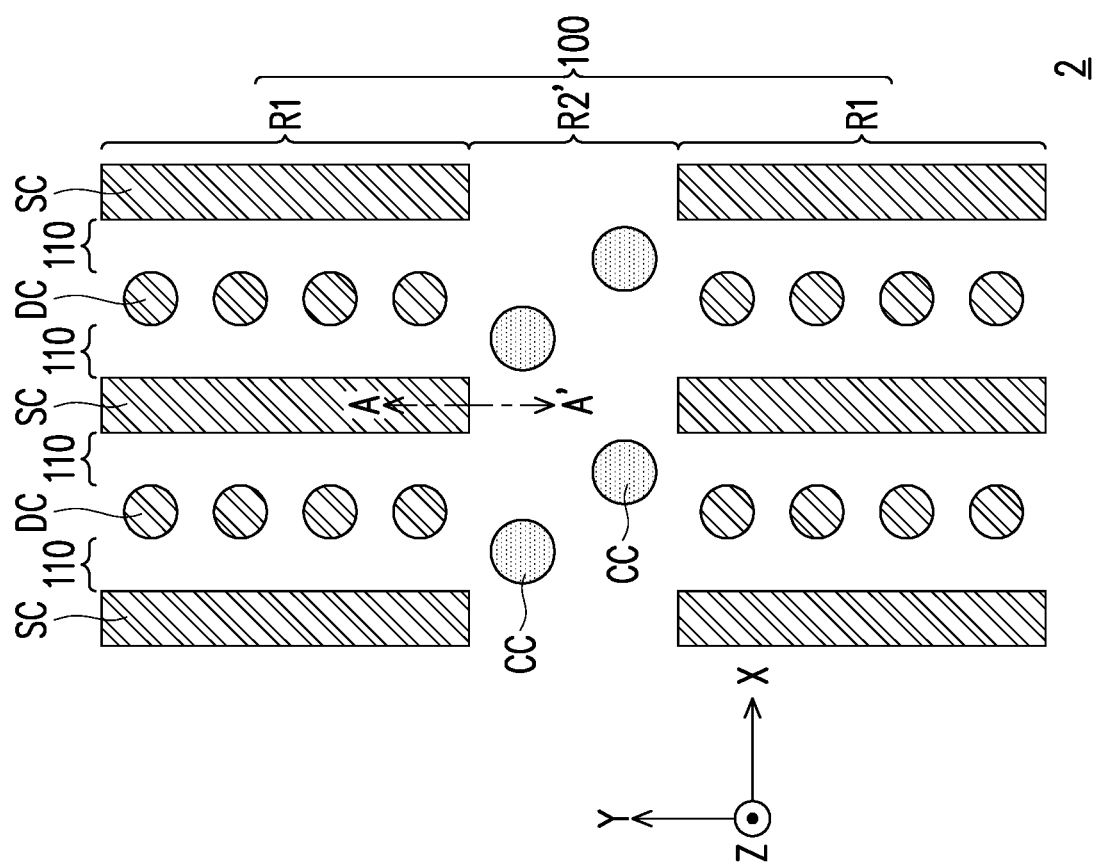
FIG. 2 is a schematic top view of a semiconductor device of the second embodiment of the disclosure.

With reference to FIG. 2, the second embodiment of the disclosure provides a semiconductor device 2 including the substrate 100, the first gate structures 110, the source contacts SC, the drain contacts DC, and multiple control gate contacts CC. The substrate 100 includes the first region R1 and a second region R2'. In an embodiment, the first region R1 may be a unit cell region, and the second region R2' may be a stitch region. The stitch region R2 may be disposed between two adjacent unit cell regions R1.

The first gate structure 110 may be disposed on the substrate 100 in the unit cell region R1. Reference has been made to the preceding embodiment for details in its disposition and material, and the same contents will not be repeated in the following. In an embodiment, the source contacts SC may be disposed on the first side of the first gate structure 110, and the drain contacts DC may be disposed on the second side of the first gate structure 110 relative to the first side. In other words, the source contacts SC and drain contacts DC may be alternately disposed along an X direction. It should be noted that the source contacts SC and the drain contacts DC have different shapes in a top view angle. Specifically, as shown in FIG. 2, the source contacts SC may be stripe patterns extending along a Y direction. The drain contacts DC may be multiple dot patterns alternately arranged along the Y direction, and the dot patterns are separated from each other. The source contacts SC and the drain contacts DC may extend along a Z direction and contact the substrate 100, as shown in FIG. 1J.

In addition, the control gate contacts CC may be disposed on the substrate 100 in the stitch region R2' to be electrically connected to the control gate 118 of the first gate structure 110 (as shown in FIG. 1J). Specifically, the control gate contacts CC may be disposed on an extension direction of the first gate structures 110 between the source contacts SC and the drain contacts DC. The control gate contacts CC may be alternately arranged along the X direction.

Figure 3A:
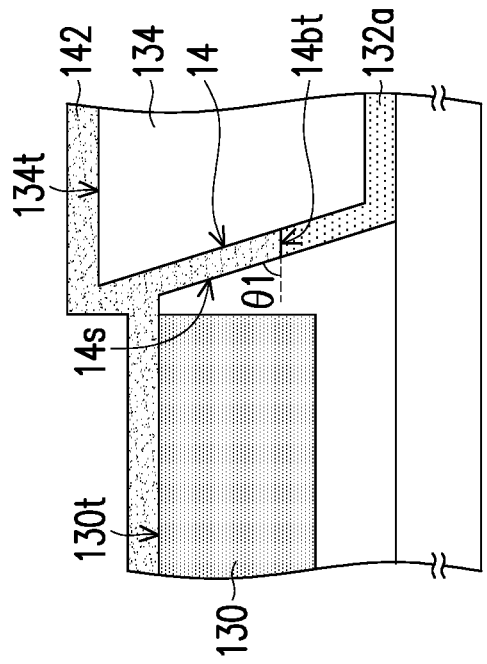

With reference to FIG. 3A, when the first etching process 140 is performed to form the first opening 10 (as shown in FIG. 1B), the stop layer 132 between the unit cell region R1 and the stitch region R2' may also be etched to form a third opening 14. Next, the protective material 142 is formed to cover the top surface 130t of the sacrificial material 130 and the top surface 134t of the ILD layer 134, and is filled in the third opening 14. It should be noted that an included angle θ1 between a sidewall 14s of the third opening 14 and a bottom surface 14bt is an acute angle, and the third opening 14 has a high aspect ratio. Therefore, in this embodiment, the eHARP may be used to form the protective material 142, thereby reducing voids of the protective material 142 in the third opening 14 and increasing the density of the protective material 142. In this embodiment, the included angle θ1 may be between 0 degrees and 87 degrees, such as 65 degrees. The aspect ratio of the third opening 14 may be between 5 and 3.25, such as 4.

Figure 3B:
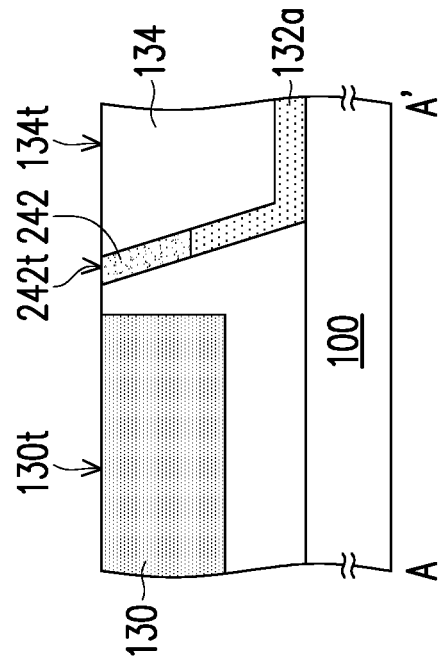

With reference to FIG. 3A and FIG. 3B, a planarization process, such as the CMP process, is performed to remove the protective material 142 on the top surface 130t of the sacrificial material 130, the protective material 142 on the top surface 134t of the ILD layer 134, and part of the ILD layer 134 to form a protective layer 242 in the third opening 14. In this case, the top surface 130t of the sacrificial material 130, a top surface 242t of the protective layer 242, and the top surface 134t of the ILD layer 134 may be regarded to be coplanar.

With reference to FIG. 3C, the sacrificial material 130 is patterned to form multiple dummy contacts 130a between the first gate structures 110. Specifically, as shown in FIG. 3C, the mask pattern 144 is formed on the substrate 100. The mask pattern 144 may cover the top surface 242t of the protective layer 242. Next, the second etching process 150 is performed by using the mask pattern 144 as a mask to remove part of the sacrificial material 130, thereby forming the second openings 12 (as shown in FIG. 1F). In this embodiment, the structure along the line A-A' is covered by the mask pattern 144, so the second openings 12 are not shown in FIG. 3C.

With reference to FIG. 3D, after the liner layer 152 and the dielectric layer 154 (as shown in FIG. 1H) are formed, an etching back process 160 is performed to remove the mask pattern 144 and expose the top surface 130t of the dummy contacts 130a and the top surface 242t of the protective layer 242. In this embodiment, since the etching back process 160 has high etching selectivity for the mask pattern 144, the mask pattern 144 composed of silicon nitride may be completely removed. In this case, the etching back process 160 may be stopped on the dummy contacts 130a composed of polysilicon and the protective layer 242 composed of silicon oxide.

With reference to FIG. 3E, a replacement process is performed to replace the dummy contacts 130a with a metal contact 230. Specifically, the dummy contacts 130a and the spacer below the dummy contacts 130a are removed to form the contact openings exposing the substrate 100. Next, a conductor material is formed to be filled in the contact opening. In following, a planarization process, such as the CMP process, is performed to remove the excess conductor material above the ILD layer 134 and the protective layer 242 to form the metal contact 230 (i.e., the source contact SC and the drain contact DC). In this case, the top surface 242t of the protective layer 242, the top surface 230t of the metal contact 230, and the top surface 134t of the ILD layer 134 may be regarded to be substantially coplanar. In this embodiment, the stop layer 132a and the protective layer 242 may be regarded as a protective structure 262. The protective structure 262 may have a lower portion (i.e., the stop layer 132a) and an upper portion (i.e., the protective layer 242) disposed on the lower portion 132a. In an embodiment, an included angle θ2 between a sidewall of the protective structure 262 and the top surface of the substrate 100 is an acute angle. In this embodiment, the included angle θ2 may be between 0 degrees and 87 degrees, such as 65 degrees.

It should be noted that this embodiment may replace silicon nitride with silicon oxide for the upper portion of the stop layer 132a. Therefore, the protective layer 242 composed of silicon oxide may protect the stop layer 132a composed of silicon nitride from being etched by the etching back process 160 and forming a groove. In this case, after a contact replacement process, no metal residue is formed on the stop layer 132a between the unit cell region R1 and the stitch region R2'. Therefore, this embodiment may avoid a leakage path formed between the source contacts SC and/or the drain contacts DC, thereby increasing the yield of the semiconductor device 2.

In summary, the embodiments of the disclosure form the protective structure between the unit cell region and the stitch region and/or between the unit cell region and the peripheral region to avoid the loss of the stop layer during the etching back process. In this case, after the contact replacement process, metal tungsten does not remain around the stitch region or the peripheral circuit region. Therefore, the embodiments of the disclosure may avoid the leakage path formed by tungsten residue between the source/drain contacts, thereby increasing the yield of the semiconductor device.

What is claimed is:
1. A semiconductor device, comprising:
a substrate, comprising a first region and a second region;
a plurality of first gate structures, disposed on the substrate in the first region; and
a protective structure, conformally covering a sidewall of one of the first gate structures adjacent to the second region without extending to cover surfaces of others of the first gate structures away from the second region, wherein the protective structure comprises:
a lower portion; and
an upper portion, disposed on the lower portion, wherein the lower portion and the upper portion have different dielectric materials, wherein the lower portion comprises:
a first vertical portion, extending along a stacking direction of the plurality of first gate structures, and having a top surface higher than top surfaces of the plurality of first gate structures and a bottom surface lower than the top surfaces of the plurality of first gate structures;
a second vertical portion, vertically offset from the first vertical portion, and contacting a bottom surface of the upper portion; and
a connect horizontal portion, connecting the first and second vertical portions, and over the top surfaces of the plurality of first gate structures,
wherein a sidewall of the upper portion is vertically aligned to a sidewall of the second vertical portion.

2. The semiconductor device according to claim 1, wherein a material of the upper portion comprises silicon oxide, and a material of the lower portion comprises silicon nitride.

3. The semiconductor device according to claim 1, wherein each first gate structure comprises:
a tunnel dielectric layer, disposed on the substrate in the first region;
a floating gate, disposed on the tunnel dielectric layer;
an inter-gate dielectric layer, disposed on the floating gate;
a control gate, disposed on the inter-gate dielectric layer; and
a cap layer, disposed on the control gate.

4. The semiconductor device according to claim 3, wherein the first region is a unit cell region, the second region is a peripheral region, and the semiconductor device further comprises at least one second gate structure disposed on the substrate in the peripheral region.

5. The semiconductor device according to claim 4, wherein the at least one second gate structure comprises:
a gate dielectric layer, disposed on the substrate in the peripheral region; and
a gate electrode, disposed on the gate dielectric layer.

6. The semiconductor device according to claim 5, further comprising:
a source contact, disposed on a first side of the first gate structures; and
a drain contact, disposed on a second side of the first gate structures relative to the first side.

7. The semiconductor device according to claim 6, further comprising:
a spacer, conformally covering a surface of the first gate structures, wherein the source contact and the drain contact are separated from the first gate structures by the spacer; and
an interlayer dielectric layer, disposed on the at least one second gate structure in the peripheral region, wherein the protective structure is clamped between the interlayer dielectric layer and the spacer, and a top surface of the upper portion of the protective structure is exposed on the interlayer dielectric layer.

8. The semiconductor device according to claim 1, wherein an interface between the lower portion and the upper portion is higher than a top surface of the first gate structures.

9. The semiconductor device according to claim 6, wherein the upper portion has a top surface substantially level with top surface of the source contact and the drain contact.

10. The semiconductor device according to claim 4, wherein the lower portion further extends to cover the at least one second gate structure in the peripheral region.

11. The semiconductor device according to claim 1, wherein the upper portion is vertically offset from the first vertical portion without overlapping each other.

12. The semiconductor device according to claim 1, wherein the first vertical portion is closer to the second region than the second vertical portion.

* * * * *